(12) United States Patent
Fujii

(10) Patent No.: US 7,817,477 B2
(45) Date of Patent: Oct. 19, 2010

(54) MANUFACTURING METHOD, REMANUFACTURING METHOD AND RESHIPPING METHOD FOR A SEMICONDUCTOR MEMORY DEVICE

(75) Inventor: Narihisa Fujii, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 208 days.

(21) Appl. No.: 12/042,591

(22) Filed: Mar. 5, 2008

(65) Prior Publication Data

US 2008/0241968 A1 Oct. 2, 2008

(30) Foreign Application Priority Data

Mar. 30, 2007 (JP) .............. 2007-091929

(51) Int. Cl.
*G11C 11/34* (2006.01)
*G11C 16/04* (2006.01)

(52) U.S. Cl. .............. 365/185.29; 365/185.28; 365/218; 438/522

(58) Field of Classification Search ............ 365/185.29; 438/522

See application file for complete search history.

(56) References Cited

U.S. PATENT DOCUMENTS

| | | | | |
|---|---|---|---|---|
| 2006/0126383 | A1* | 6/2006 | Shappir et al. ............ | 365/185.2 |
| 2008/0268659 | A1* | 10/2008 | Wu et al. .................... | 438/795 |
| 2009/0129593 | A1* | 5/2009 | Ishii ............................ | 380/59 |

FOREIGN PATENT DOCUMENTS

| | | | |
|---|---|---|---|
| JP | 02-003981 | A | 1/1990 |
| JP | 02003981 | A * | 1/1990 |
| JP | 02117174 | A * | 5/1990 |
| JP | 2000-003948 | A | 1/2000 |
| JP | 2002350512 | A | 12/2002 |
| JP | 2003-173690 | A | 6/2003 |
| JP | 2005-064295 | | 3/2005 |
| JP | 2007-173502 | | 7/2007 |

OTHER PUBLICATIONS

Japanese Office Action; Notice of Reason for Rejection dated May 19, 2009; Japanese Patent Application No. 2007-091929 with English Translation.
Japanese Office Action "Notice of Reason for Rejection" dated Mar. 4, 2009 Japanese Application No. 2007-091929 with English Translation.

* cited by examiner

*Primary Examiner*—Ly D Pham
(74) *Attorney, Agent, or Firm*—Studebaker & Brackett PC; Donald R. Studebaker

(57) ABSTRACT

A manufacturing method, remanufacturing method and reshipping method for a semiconductor memory device capable of preventing the charge hold characteristic from deteriorating even if information data is repeatedly written and erased. The manufacturing method is for a semiconductor memory device having a plurality of memory cells in an FET structure formed on a semiconductor substrate, wherein each of the plurality of memory cells is to store a unit bit and hold information data. Preparing a plurality of memory cells, bits of the information data are written to the memory cells. After writing the information data bits to the memory cells, the memory cells are allowed to stand at a predetermined ambient temperature for a predetermined time. Thereafter, bits of the information data are written to the memory cells.

3 Claims, 6 Drawing Sheets

FIG. 3

|  | Vg | Vs | Vd | Vb |
|---|---|---|---|---|
| WRITE | 10V | 0V | 5V | 0V |
| READ | 3V | 1.5V | 0V | 0V |
| ERASE 1 | −6V | 0V | 5V | 0V |
| ERASE 2 | −6V | OPEN | 6V | 0V |
| ERASE 3 | −6V | 6V | 6V | 0V |

MANUFACTURING METHOD, REMANUFACTURING METHOD AND RESHIPPING METHOD FOR A SEMICONDUCTOR MEMORY DEVICE

BACKGROUND OF THE INVENTION

1. Technical Field

The present invention relates to a manufacturing method for a semiconductor memory device formed by a plurality of memory cells in an FET structure, and to a remanufacturing method and reshipping method for such a semiconductor memory device.

2. Description of the Related Art

As a memory device not requiring power in holding information data, there is a non-volatile semiconductor memory device having a plurality of memory cells in an FET structure (in a field-effect transistor structure with a source, a gate and a drain) with using the charge traps in its insulation film for charge storage. For example, see Japanese Patent Kokai No. 2005-64295 (patent document 1). In the non-volatile semiconductor memory device like this, its charge hold characteristic deteriorates due to the repeated writing and erasure of information data. In addition, disturbance is readily undergone upon writing information data. Disturbance refers to the influence that a certain memory cell is to suffer when writing information data to another memory cell. For this reason, the information data is practically not rewritten for the non-volatile semiconductor memory after once being written with information data. Such a non-volatile semiconductor memory, whose information data after written is not to be rewritten, is utilized as a memory device for storing a program. In some cases, program rewriting is desirably not allowed. The non-volatile semiconductor memory device, structured not to rewrite information data after once being written with information data, is capable of preventing its program from being falsified and hence suited as a memory device for storing a program.

SUMMARY OF THE INVENTION

In the device like the above, the charge trap in the insulation film is used for charge storage. The writing and erasure of information data, if repeated, deteriorates the charge hold characteristic. In addition, disturbance is readily undergone upon writing information data. For this reason, such a non-volatile semiconductor memory device is used as a memory device for storing a program wherein information data, after once written, is practically not rewritten. Meanwhile, because information data after once written is not rewritten, the program can be prevented from being falsified. However, during program development, the information data held by the non-volatile semiconductor memory device is desirably rewritten in order for program correction, etc. In case rewriting is allowed for the information data held by a nonvolatile semiconductor memory device storing a program, the operation of a corrected program can be confirmed at the relevant site by use of the same nonvolatile semiconductor memory device.

Meanwhile, in the manufacture process of a nonvolatile semiconductor memory device, information data is written and erased in order to confirm the operation of the nonvolatile semiconductor memory device. After the operational confirmation, the nonvolatile semiconductor memory device is written with information data and then shipped out. Where information data is written and erased in this manner in order to confirm the operation, the charge hold characteristic after that is deteriorated.

It is an object of the present invention to provide a manufacturing method, remanufacturing method and reshipping method for a semiconductor memory device that the charge hold characteristic can be prevented from deteriorating even if information data is written and erased repeatedly.

A manufacturing method for a semiconductor memory device according to the present invention is a method of manufacturing a semiconductor memory device having a plurality of memory cells in an FET structure formed on a semiconductor substrate, each of the plurality of memory cells being to store a unit bit and hold information data, the method including: a preparing step that prepares the plurality of memory cells; a writing step that writes bits of the information data to the memory cells; a baking step that allows the memory cells to stand at a predetermined ambient temperature for a predetermined time after the writing step; and a rewriting step that writes bits of the information data to the memory cells after the baking step.

A remanufacturing method for a semiconductor memory device according to the invention is a method of remanufacturing a semiconductor memory device having a plurality of memory cells in an FET structure formed on a semiconductor substrate, each of the plurality of memory cells being to store a unit bit and hold information data, the method including: an erasing step that erases written information data already written on the memory cells; a writing step of writing bits of new information data to the memory cells after the erasing step; a baking step that allows the memory cells to stand at a predetermined ambient temperature for a predetermined time after the writing step; and a rewriting step that writes bits of the new information data to the memory cells after the baking step.

A reshipping method for a semiconductor memory device according to the invention is a method of reshipping a semiconductor memory device having a plurality of memory cells in an FET structure formed on a semiconductor substrate, each of the plurality of memory cells being to store a unit bit and hold information data, the method including: a step of forming a plurality of memory cells on a semiconductor wafer; a step of breaking a plurality of semiconductor memory devices constituted by the plurality of memory cells into individual pieces; a step of packaging the plurality of semiconductor memory devices thus divided; a first writing step of writing first data based on a data write request from a customer, to the memory cells of the semiconductor memory device thus packaged; a step of shipping the semiconductor memory device to the customer; a step of receiving the semiconductor memory device written with the first data from the customer; a step of erasing the first data written in the semiconductor memory device; a second writing step of writing second data based on a data rewriting request from the customer, to the semiconductor memory device; a baking step of allowing the semiconductor memory device to stand at a predetermined ambient temperature for a predetermined time after the second writing step; a third writing step of writing the second data to the memory cells of the semiconductor memory device after the baking step; and a reshipping step of shipping again the semiconductor memory device written with the second data to the customer.

BRIEF DESCRIPTION OF THE DRAWINGS

FIG. 3 is a figure showing an example of a voltage applying condition table representing a voltage applying condition for writing, reading and erasing information data for the memory cell of FIG. 1;

DETAILED DESCRIPTION OF THE INVENTION

With reference to the drawings, explanation will now be made in detail on an embodiment according to the present invention.

Figure 1:
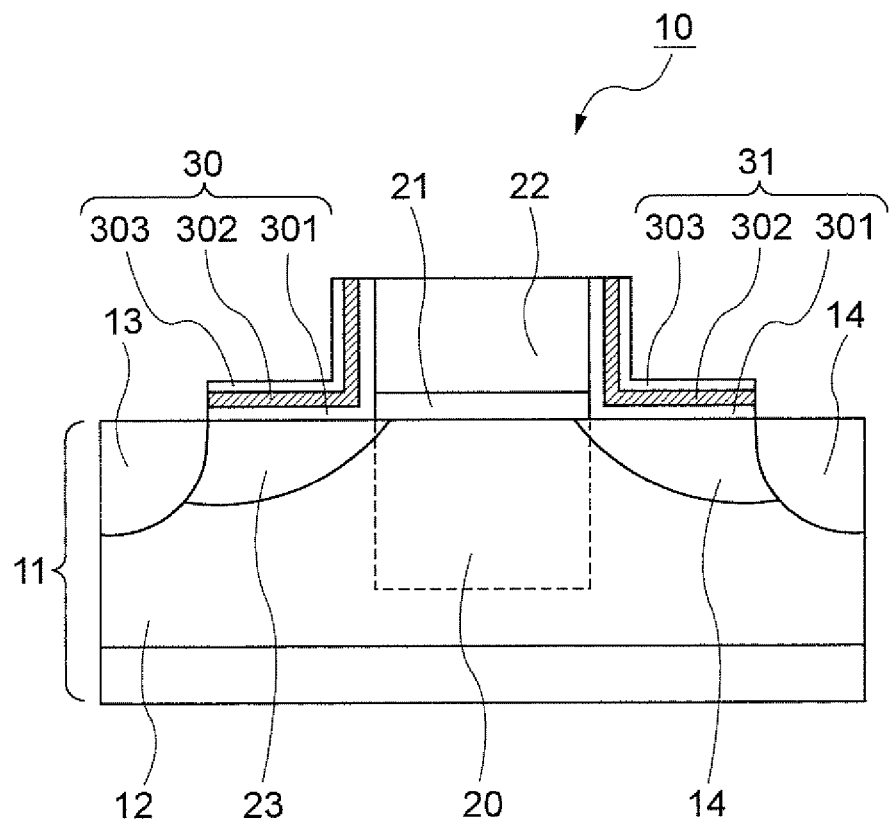
FIG. 1 is a sectional view showing a structure of a memory cell constituting a semiconductor memory device to be manufactured by a manufacturing method for a semiconductor memory device according to the present invention.

FIG. 1 shows a structure of a memory cell 10 making up a semiconductor memory device to be manufactured by a manufacturing method for a semiconductor memory device according to the invention. The memory cell 10 is of an FET structure having a gate electrode 22 formed on a semiconductor substrate 11, first and second charge storage parts 30, 31 formed on the both sides of the gate electrode 22, a source electrode region 13, a drain electrode region 14, a first resistance-change region 23 and a second resistance-change region 24.

A p-well region 12 is formed in a surface of a semiconductor substrate 11, e.g. p-type silicon substrate. In the surface of the p-well region 12, the source and drain electrode regions 13, 14 are provided containing a high concentration of an n-type impurity ($n^+$ type). The source electrode region 13 and the drain electrode region 14 are each provided with a metal electrode layer through a contact layer.

The gate electrode 22 is formed over a part of the p-well region 12 lying between the source electrode region 13 and the drain electrode region 14, through a gate dielectric film 21. The gate dielectric film 21 uses, for example, a silicon oxide film ($SiO_2$) while the gate electrode 22 uses, for example, polysilicon (polycrystalline silicon). In a surface of the p-well region 12 lying between the source electrode region 13 and the drain electrode region 14, a channel region 20 is provided to form a channel (current path) between the source electrode region 13 and the drain electrode region 14.

Between the source electrode region 13 and the channel region 20, the first resistance-change region 23 is provided adjacent to the source electrode region 13. Meanwhile, between the drain electrode region 14 and the channel region 20, the second resistance-change region 24 is provided adjacent to the drain electrode region 14. The first and second resistance-change regions 23, 24 are lower in n-type impurity concentration ($n^-$-type) than the source electrode region 13 and drain electrode region 14.

Over the first resistance-change region 23, the first charge-storage part 30 is provided in contact with the first resistance-change region 23. Meanwhile, over the second resistance-change region 24, the second charge-storage part 31 is provided in contact with the second resistance-change region 24. The first and second charge-storage parts 30, 31 are insulation films each having an ONO (oxide nitride oxide) overlay structure. The ONO overlay structure is formed by laying a silicon oxide film (first oxide film) 301, a silicon nitride film (SiN) 302 and a silicon oxide film (second oxide film) 303 one over another, thus providing a stable charge storage capability.

Figure 2:
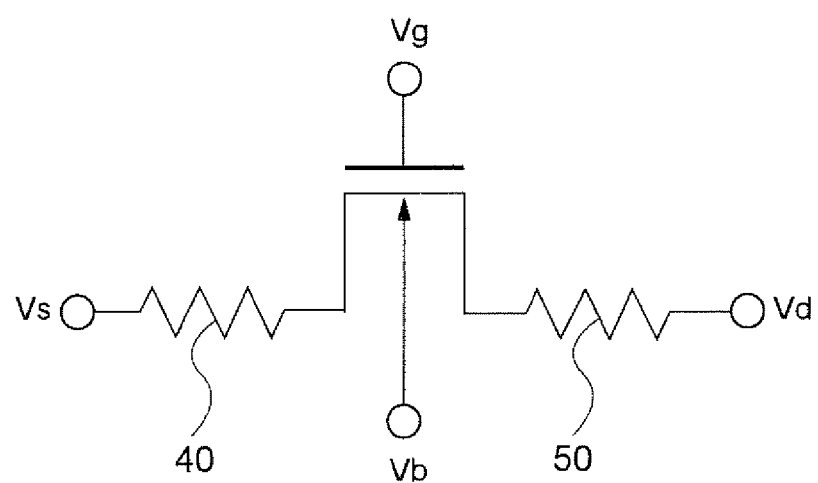
FIG. 2 is a circuit diagram showing an equivalent circuit of the memory cell in FIG. 1.

FIG. 2 shows an equivalent circuit of the memory cell 10. The equivalent circuit of the memory cell 10 is configured with a MOSFET, a first variable resistance 40 connected to the MOSFET at a side closer to the source electrode region 13, and a second variable resistance 50 connected thereto at a side closer to the drain electrode region 14.

Explanation is now made on a method of writing information data (logic value "1" or "0") to the memory cell 10. Incidentally, the initial state before writing information data is assumed here as a state that the first and second charge-storage parts 30, 31 are not written with information data, i.e. a state that logic value "1" is stored on the first charge-storage part 30 and the second charge-storage part 31. In this state, explanation is made on the operation of writing logic value "0" as information data to the second charge-storage part 31 located closer to the drain electrode region 14 of the memory cell 10.

FIG. 3 shows a voltage applying condition table representing a voltage application condition upon writing, reading and erasing information data for the memory cell 10. In the case of writing logic value "0" as information data to the second charge-storage part 31, the application voltage Vg to the gate electrode 22 is assumed 10V, the application voltage Vs to the source electrode region 13 is 0V, and the application voltage Vd to the drain electrode region 14 is 6V, as shown at "write" in the voltage applying condition table. Meanwhile, the application voltage Vb to a back gate is assumed 0V.

In the case of applying a voltage under the condition as above, electric field concentration takes place in the second resistance-change region 24 lower in impurity concentration, or greater in resistance, than the drain electrode region 14, on the side closer to the drain electrode region 14. Consequently, hot electrons, i.e. hot carriers, are caused intensively in the second resistance-change region 24. The generated hot electrons get through a potential barrier caused by the silicon oxide film (first oxide film) 301 of the second charge-storage part 31 formed on the second resistance-change region 24, thus being injected to the silicon nitride film (SiN) 302 provided as a charge storage film. The hot electrons, injected in the silicon nitride film (SiN) 302, are confined in the silicon nitride film (SiN) 302 by means of the potential barrier caused by the silicon oxide film (first oxide film) 301 and the silicon oxide film (second oxide film) 303. In this manner, logic value "0", i.e. information data, is held on the second charge-storage part 31.

Explanation is now made on a method of reading the information data held on the memory cell 10. Here, it is assumed to read out logic value "0", i.e. information data, being stored in the second charge-storage part 31 of the memory cell 10 on the side closer to the drain electrode region 14. In this case, voltage is applied under the condition shown at "read" in the voltage applying condition table. The application voltage Vg to the gate electrode 22 is assumed 3V while the application voltage Vs to the source electrode region 13 is 1.5V. Meanwhile, the application voltage Vd to the drain electrode region 14 and the application voltage Vb to the back gate are both assumed 0V.

In the case that logic value "0" is being held as information data in the second charge-storage part 31, the second resistance-change region 24 has an increased resistance value. This makes it not easy to form a channel through the channel region 20, thus reducing the current to a small value. Incidentally, in the case that logic value "1" is being held as information data in the second charge-storage part 31, the second resistance-change region 24 has a decreased resistance value. This makes it easy to form a channel through the channel region 20, thus increasing the current to a great value. The information data held on the memory cell 10 is read out by utilizing the difference in the amount of current.

Explanation is now made on a method of electrically erasing the information data held in the memory cell 10.

In the case of electrically erasing the information data (logic value "0") held on the second charge-storage part 31 of the memory cell 10 on the side closer to the drain electrode region 14, voltage is applied under the condition shown at "erase 1" or "erase 2" in the voltage applying condition table. The application voltage Vg to the gate electrode 22 is assumed −6V, the application voltage Vs to the source electrode region 13 is 0V or indefinite state (also referred to as open state), and the application voltage Vd to the drain electrode region 14 is 6V. Meanwhile, the application voltage Vb to the back gate is assumed 0V.

In the case of applying a voltage under the condition as above, electric field concentration takes place in the opposite direction to that of writing information data, in the second resistance-change region 24 lower in impurity concentration, or greater in resistance, than the drain electrode region 14, on the side closer to the drain electrode region 14. Consequently, hot holes, i.e. hot carriers opposite in polarity to those in writing information data, are caused intensively in the second resistance-change region 24. The generated hot holes get through a potential barrier caused by the silicon oxide film (first oxide film) 301 of the second charge-storage part 31 formed over the second resistance-change region 24, thus being injected to the silicon nitride film (SiN) 302 provided as a charge storage film. By the hot holes injected into the silicon nitride film (SiN) 302, the hot electrons being held are neutralized. In this manner, erased is the logic value "0", or information data, being held in the second charge-storage part 31.

Meanwhile, in the case of electrically erasing the pieces of information data (logic value "0") respectively held on the first and second charge-storage parts 30, 31 of the memory cell 10, voltage is applied under the condition shown at "erase 3" in the voltage applying condition table. The application voltage Vg to the gate electrode 22 is assumed −6V, the application voltage Vs to the source electrode region 13 is 6V, and the application voltage Vd to the drain electrode region 14 is 6V. Meanwhile, the application voltage Vb to the back gate is assumed 0V.

In the case of applying a voltage under the condition as above, electric field concentration takes place in the opposite direction to that of writing information data, in the first resistance-change region 23 lower in impurity concentration, or greater in resistance, than the source electrode region 13, on the side closer to the source electrode region 13. Consequently, hot holes, i.e. hot carriers opposite in polarity to those in writing information data, are caused intensively in the first resistance-change region 23. Meanwhile, on the side closer to the drain electrode region 14, electric field concentration takes place in the opposite direction to that of writing information data, in the second resistance-change region 24 lower in impurity concentration, i.e. greater in resistance, than the drain electrode region 14. Consequently, hot holes, i.e. hot carriers opposite in polarity to those in writing information data, are caused intensively in the second resistance-change region 24. The generated hot holes get through a potential barrier caused by the silicon oxide film (first oxide film) 301 of the first and second charge-storage parts 30, 31, thus being injected to the silicon nitride film (SiN) 302 provided as a charge storage film. By the hot holes injected in the silicon nitride film (SiN) 302, the hot electrons being held in the first and second charge-storage parts 30, 31 are neutralized. In this manner, erased is the logic value "0", or information data, being held in the first and second charge-storage parts 30, 31.

After electrically erasing the information data held in the memory cell 10 through the application of a voltage in this manner, the semiconductor memory device is allowed to stand at a predetermined ambient temperature for a predetermined time (hereinafter, referred to as neutralization bake). For example, it is allowed to stand at a temperature of 350° C. for 2 hours. By performing the neutralization bake following the electrical erasure, completed is the erasure of the information data held in the memory cell 10.

Figure 4:
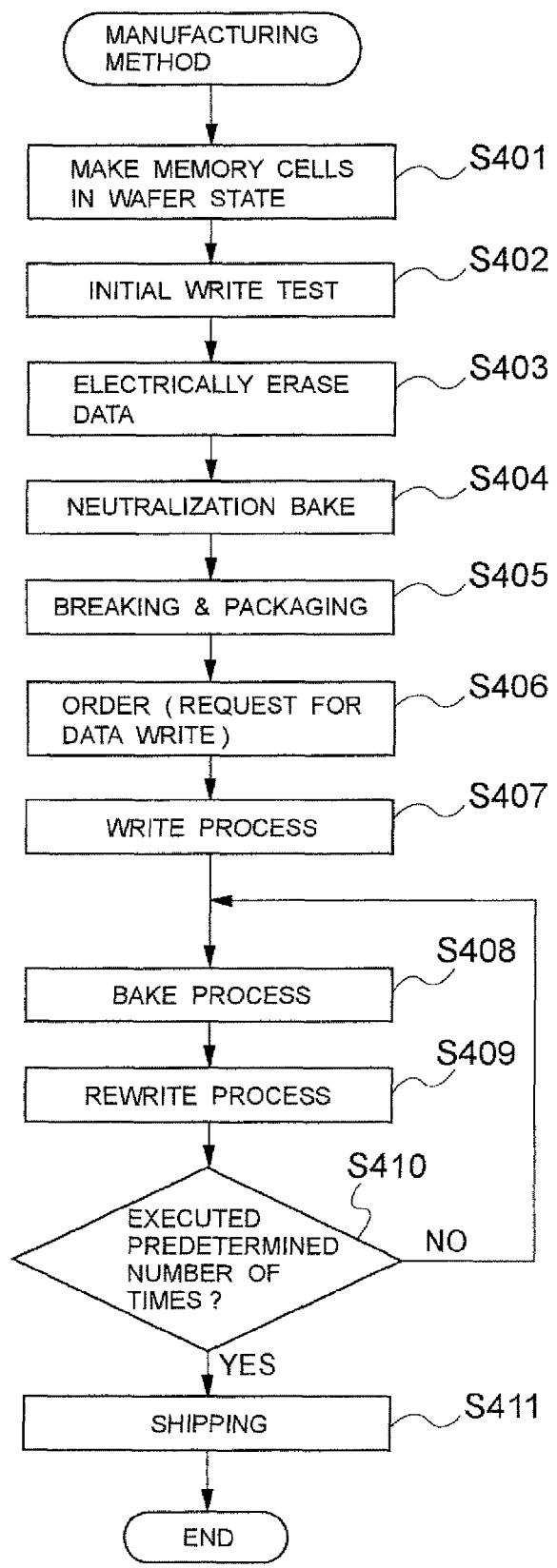
FIG. 4 is a flowchart showing a manufacturing method for a semiconductor memory device constituted by the memory cell of FIG. 1.

Explanation is now made on a manufacturing method for a semiconductor memory device. FIG. 4 shows a manufacturing method for a semiconductor memory device.

At first, a plurality of memory cells are formed on a semiconductor substrate in a wafer state (step S401). Then, initial write test is conducted for the memory cells thus formed (step S402). In the initial write test, read test is first made for the data held in every memory cell formed on the semiconductor substrate. The memory cell, in which reading has not been made normally, is determined unacceptable. Then, part of memory cells is selected and logic value "0" is written as data to the selected memory cells. The data is then read out of every memory cell. Those memory cells, in which reading has not been made normally, are determined unacceptable. Then, logic value "0" is written as data to all the memory cells to which logic value "0" has not been written as data. The data is read out of every memory cell. The memory cell, in which reading has not been made normally, is determined unacceptable.

After the initial write test, the logic value "0" whose data has been held by the memory cell is electrically erased away (step S403). The electrical erasure of the data, held by the memory cell, is conducted according to the method of electrically erasing information data explained before. After the electrical erasure, neutralization bake is performed on the semiconductor substrate on which the memory cells are formed (step S404). Neutralization bake is performed by allowing the semiconductor substrate to stand at a temperature, for example, of 350° C. for 2 hours. After neutralization bake, the semiconductor memory devices constituted by a plurality of memory cells are broken into individual pieces for packaging (step S405).

Thereafter, in case there is an order (request for data write) from a customer (step S406), a write process is executed to write information data to the semiconductor memory device (step S407). The writing of information data to the memory cells, making up the semiconductor memory device, is performed according to the information data writing method explained before. After the write process, a bake process is performed (step S408). In the bake process, the semiconductor memory device is allowed to stand at a predetermined ambient temperature for a predetermined time. For example, it is allowed to stand at a temperature of 125° C. for 15 hours. After the bake process, a rewrite process is performed to write again, to the semiconductor memory device, the same information data as that written in the write process (step S409). Confirming that the bake process and rewrite process have been executed a predetermined number of times (step S410), the semiconductor memory device already written with data is shipped to the customer (step S411).

Figure 5:
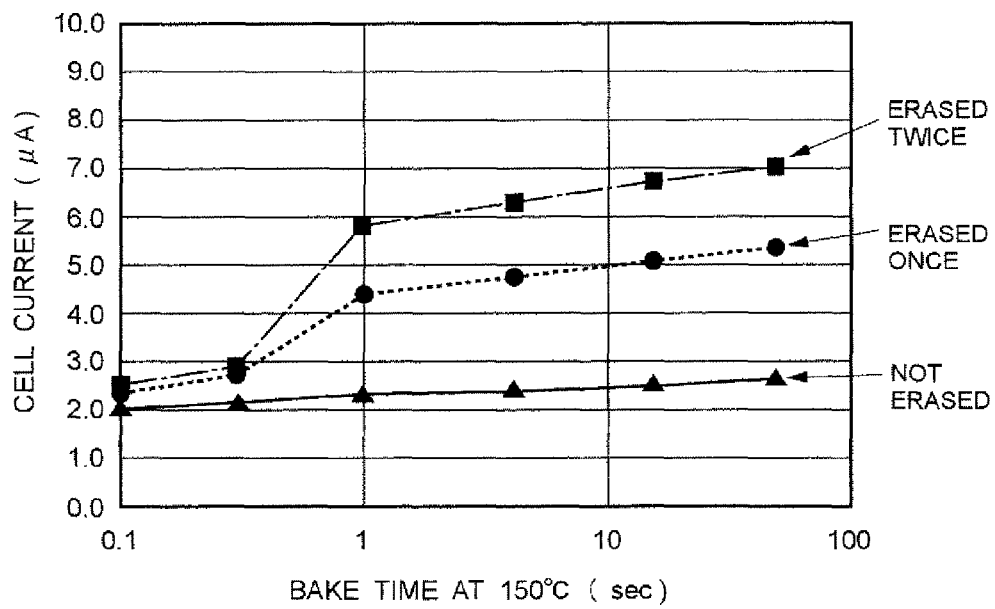
FIG. 5 is a graph showing a change in time of cell current through the memory cell of FIG. 1.

FIG. 5 shows a variation in time of cell current where a data-written semiconductor memory device already written with information data has been allowed to stand at a temperature of 150° C. The solid line represents a variation in time of cell current where information data has been written to a data-written semiconductor memory device not yet electrically erased of information data. The dotted line represents a variation in time of cell current where information data has been written to a data-written semiconductor memory device once electrically erased of information data. The one-dot chain line represents a variation in time of cell current where information data has been written to a data-written semiconductor memory device twice electrically erased of information data. From the figure, it can be seen that, as the number of times of electrical erasures of information data increases, the cell current also increases to worsen the charge hold characteristic.

Figure 6:
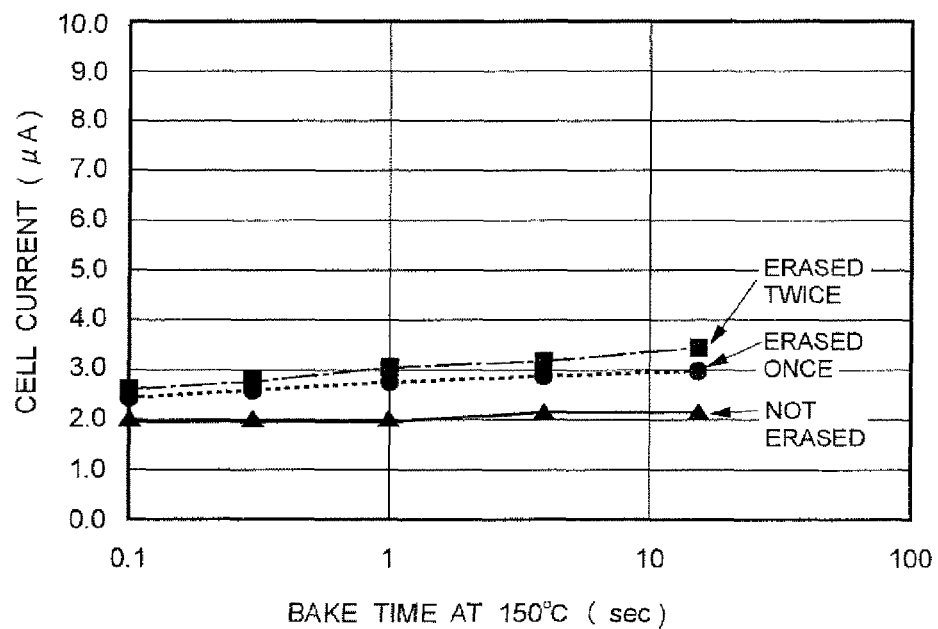
FIG. 6 is a graph showing a change in time of cell current through the memory cell of FIG. 1.

FIG. 6 shows a variation in time of cell current where a data-written semiconductor memory device, which has been allowed to stand at a temperature of 150° C. for 50 hours after being written with information data and then written with the same information data again, has been allowed to stand at a temperature of 150° C. The solid line represents a variation in time of cell current where a data-written semiconductor memory device, not yet electrically erased of information data, has been written with information data and then allowed to stand at a temperature of 150° C. for 50 hours followed by being written with information data again. The dotted line represents a variation in time of cell current where a data-written semiconductor memory, once electrically erased of information data, has been written with information data and then allowed to stand at a temperature of 150° C. for 50 hours followed by being written with information data again. The one-dot chain line represents a variation in time of cell current where a data-written semiconductor memory, twice electrically erased of information data, has been written with information data and then allowed to stand at a temperature of 150° C. for 50 hours followed by being written with information data again. From the figure, it can be seen that, even if the number of times of electrical erasures of information data increases, the cell current is suppressed from increasing without the deterioration in the charge hold characteristic. From this fact, it can be seen that the charge hold characteristic can be improved greatly by allowing the data-written semiconductor memory device to stand at a predetermined ambient temperature for a predetermined time after being written with information data, followed by writing the same information data to it again.

Figure 7:
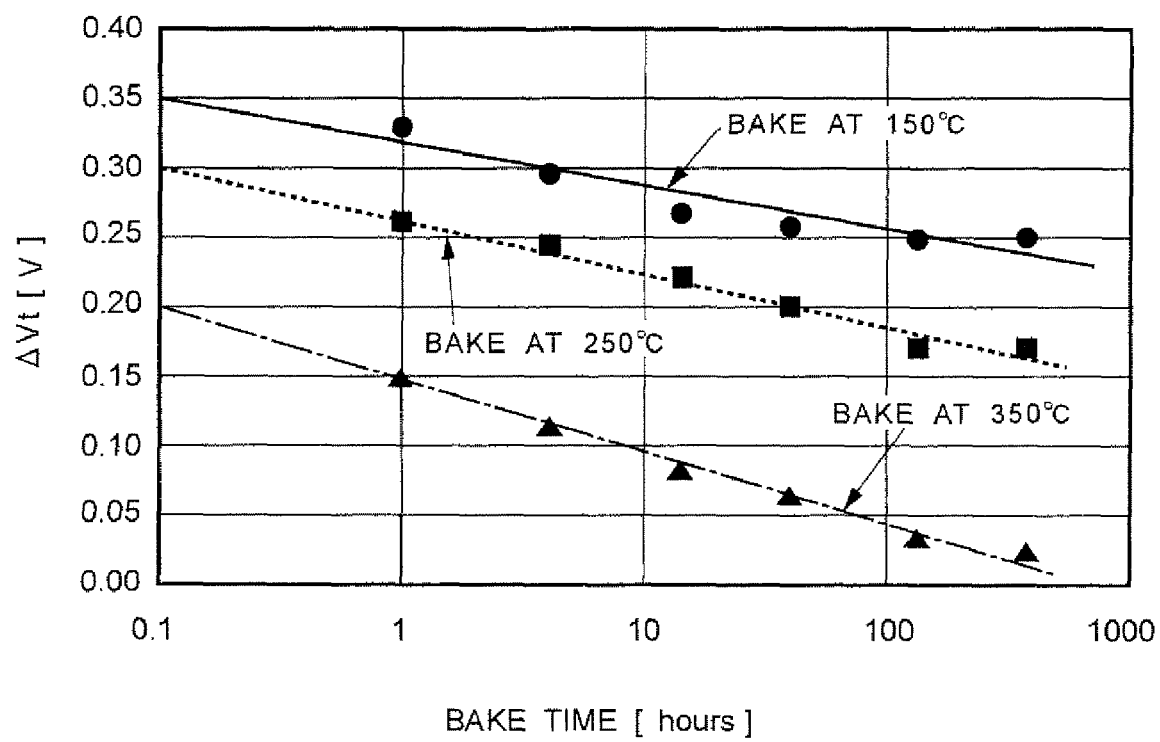
FIG. 7 is a graph showing a relationship between a threshold voltage variation and a bake time for the memory cell of FIG. 1.

FIG. 7 shows a variation of memory cell threshold voltage dependent upon a change of temperature and time in a bake process. The solid line represents a relationship between a bake time and a threshold voltage difference ΔVt where bake process has been done at a temperature of 150° C. The bake time means a time for which a data-written semiconductor memory device is allowed to stand at a predetermined ambient temperature, at a temperature of 150° C. in this case. The threshold voltage difference ΔVt is a difference absolute value between a threshold voltage Vt of the memory cell in an initial state and a threshold voltage Vt of the memory cell bake-processed. The dotted line represents a relationship between a bake time and a threshold voltage difference ΔVt where bake process has been done at a temperature of 250° C. The one-dot chain line represents a relationship between a bake time and a threshold voltage difference ΔVt where bake process has been done at a temperature of 350° C. In order to obtain a characteristic approximate to that of a memory cell in an initial state, there is a need to suppress the threshold voltage difference ΔVt at a low value. From this figure, it can be seen that, by increasing the temperature in the bake process, the threshold voltage difference ΔVt can be suppressed at a low value even with a short bake time. For example, where to obtain the equivalent value to the threshold voltage difference ΔVt for the case allowing to stand at a temperature of 150° C. for 4 hours, the device with a temperature of 250° C. is satisfactorily allowed to stand for 0.1 hour (6 minutes). In this manner, with a raised temperature in the bake process, the equivalent characteristic to that of a longer time of bake at a low temperature can be obtained in a shorter bake time. Therefore, bake time can be shortened by raising the bake temperature.

In this manner, according to the manufacturing method for a semiconductor memory device in the invention, a bake process is performed after a write process for writing information data. After the bake process, a rewrite process is performed to again write the same information data as that of the write process. Accordingly, the charge hold characteristic can be improved for the semiconductor memory device already written with data. In addition, bake time can be shortened by raising the bake temperature.

In the following, explanation is made on an embodiment concerning a semiconductor memory device remanufacturing method and reshipping method according to the invention.

FIG. 1 shows a structure of a memory cell 10 making up a semiconductor memory device. This is similar to the structure of the memory cell 10 making up a semiconductor memory device to be manufactured according to the foregoing manufacturing method for a semiconductor memory device. In addition, the information data writing method, reading method and electrical erasing method for the memory cell 10 is similar to the method explained before.

Figure 8:
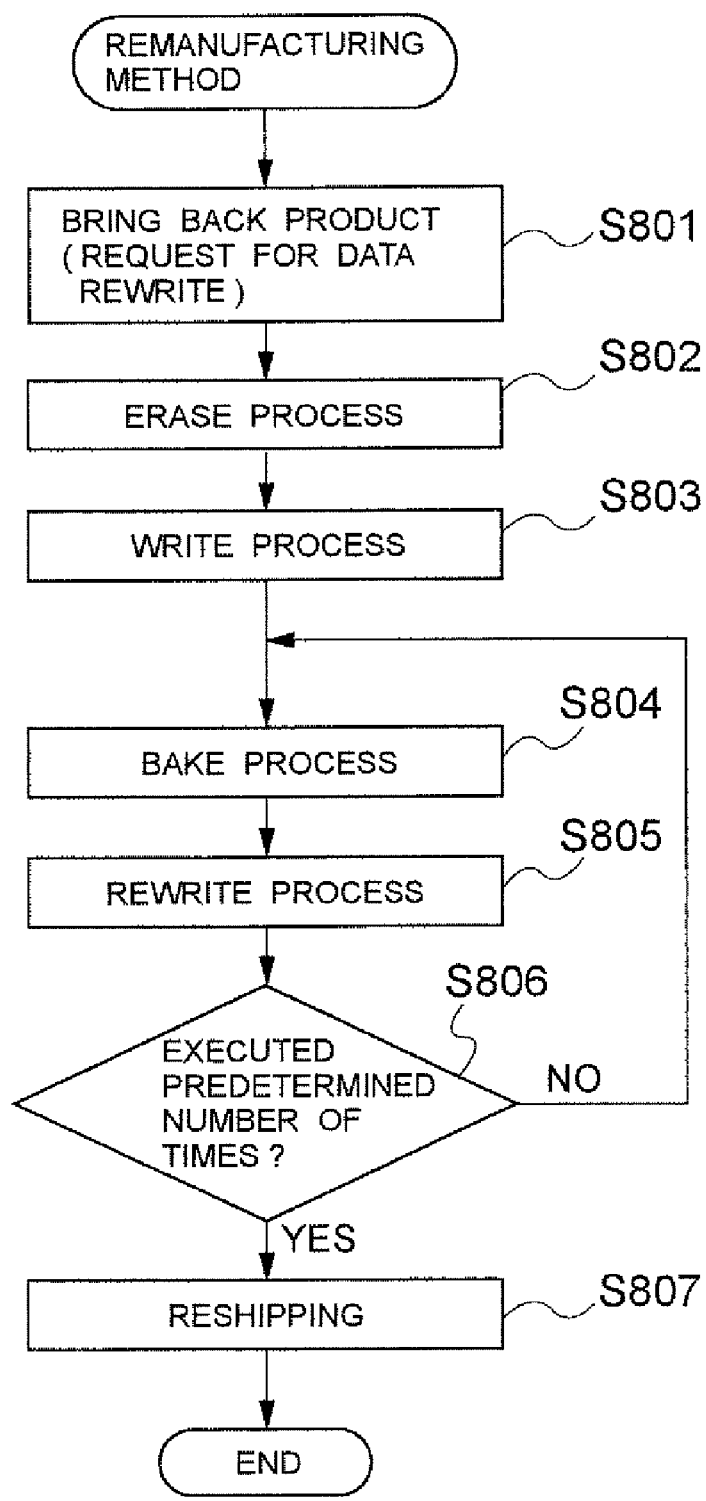
FIG. 8 is a flowchart showing a remanufacturing method for a semiconductor memory device constituted by the memory cell of FIG. 1.

FIG. 8 shows a remanufacturing method for a semiconductor memory device that new information data is written to a data-written semiconductor memory device already written with information data and once shipped so that the semiconductor memory device can be shipped again, i.e. repair method for re-using the semiconductor memory device.

At first, a data-written semiconductor memory device, i.e. a shipped product, is brought back in order to rewrite its data (step S801). After bringing back the data-written semiconductor memory device, an erase process is performed to erase the written information data held by the semiconductor memory device already written with data (step S802). In the erase process, the written information data held by the semiconductor memory device is electrically erased away. The information data, held on the memory cells making up the semiconductor memory device, is electrically erased according to the information-data electrical erasing method explained before. After the erase process, a write process is performed to write new information data to the semiconductor memory device (step S803). The writing of information data, to the memory cells making up the semiconductor memory device, is performed according to the information-data writing method explained before. After the write process, a bake process is performed (step S804). In the bake process, the data-written semiconductor memory device is allowed to stand at a predetermined ambient temperature for a predetermined time. For example, it is allowed to stand at a temperature of 125° C. for 15 hours. After the bake process, a rewrite process is performed to again write the same information data as that written in the write process to the data-written semiconductor memory device (step S805). Confirming that the bake and rewrite processes are executed a predetermined number of times (step S806), the semiconductor memory device written with data is shipped again (step S807).

In this manner, the charge hold characteristic can be improved greatly by writing new information data after erasing the written information data and then writing information data again to the data-written semiconductor memory device after allowing it to stand at a predetermined ambient temperature for a predetermined time. In addition, the data-written semiconductor memory device can be improved in yield because of not performing a neutralization bake process that allows the data-written semiconductor memory device to stand at an elevated temperature (e.g. 300° C.). Therefore, the data-written semiconductor memory device once shipped can be shipped again after being rewritten with its information data.

Incidentally, the memory cell making up the semiconductor memory device uses a memory cell structured with charge-storage parts on the both sides of the gate electrode. Alternatively, it is possible to use a memory cell structured with charge-storage parts in the channel region underneath the gate electrode. Meanwhile, in the bake process, the data-written semiconductor memory device was allowed to stand at a temperature of 125° C. for 15 hours. However, the temperature and time in the bake process is not limited to the above. For example, a data-written semiconductor memory device may be allowed to stand at a temperature of 150° C. for 4 hours.

As explained above, according to the manufacturing method for a semiconductor memory device in the invention, a bake process is performed following a write process to write information data. Following the bake process, a rewrite process is performed to write again the same information data as that of the write process. Therefore, the charge hold characteristic can be improved for the data-written semiconductor memory device.

Meanwhile, according to the semiconductor memory device remanufacturing method and reshipping method in the invention, a data-written semiconductor memory device, being written with information data and once shipped, is erased of information data already written. After a write process to write new information data, a bake process is performed. After the bake process, a rewrite process is performed to again write the same information data as that of the write process. Therefore, the charge hold characteristic can be improved for the data-written semiconductor memory device so that a data-written semiconductor memory device, once shipped, can be reshipped after being rewritten with its information data.

This application is based on Japanese Patent Application No. 2007-091929 which is hereby incorporated by reference.

What is claimed is:

1. A method of manufacturing a semiconductor memory device having a plurality of memory cells in an FET structure formed on a semiconductor substrate, each of the plurality of memory cells being to store a unit bit and hold information data, the method comprising:
    a preparing step that prepares the plurality of memory cells;
    a writing step that writes bits of the information data to the memory cells;
    a baking step that allows the memory cells to stand at a predetermined ambient temperature for a predetermined time after the writing step; and
    a rewriting step that writes bits of the information data to the memory cells after the baking step;
    wherein the semiconductor memory device, before written with the information data to the memory cells, is processed with a step of electrical erasing data being held by the memory cell and a step of neutralization baking of allowing the semiconductor memory device to stand at a first ambient temperature for a first time, the predetermined ambient temperature in the baking step being lower than the first ambient temperature in the neutralization baking step.

2. A method of remanufacturing a semiconductor memory device having a plurality of memory cells in an FET structure formed on a semiconductor substrate, each of the plurality of memory cells being to store a unit bit and hold information data, the method comprising:
    an erasing step that erases written information data already written on the memory cells;
    a writing step that writes bits of new information data to the memory cells after the erasing step;
    a baking step that allows the memory cells to stand at a predetermined ambient temperature for a predetermined time after the writing step; and
    a rewriting step that writes bits of the new information data to the memory cells after the baking step;
    wherein the semiconductor memory device, before written with the information data to the memory cells, is processed with a step of electrical erasing data being held by the memory cell and a step of neutralization baking of allowing the semiconductor memory device to stand at a first ambient temperature for a first time, the predetermined ambient temperature in the baking step being lower than the first ambient temperature in the neutralization baking step.

3. A method of reshipping a semiconductor memory device having a plurality of memory cells in an FET structure formed on a semiconductor substrate, each of the plurality of memory cells being to store a unit bit and hold information data, the method comprising:
    a step of forming the plurality of memory cells on a semiconductor wafer;
    a step of breaking the plurality of semiconductor memory devices constituted by the plurality of memory cells into individual pieces;
    a step of packaging the plurality of semiconductor memory devices thus divided;
    a first writing step of writing first data based on a data write request from a customer, to the memory cells of the semiconductor memory device thus packaged;
    a step of shipping the semiconductor memory device to the customer;
    a step of receiving the semiconductor memory device written with the first data from the customer;
    a step of erasing the first data written in the semiconductor memory device;
    a second writing step of writing second data based on a data rewriting request from the customer, to the semiconductor memory device;
    a baking step of allowing the semiconductor memory device to stand at a predetermined ambient temperature for a predetermined time after the second writing step;
    a third writing step of writing the second data to the memory cells of the semiconductor memory device after the baking step; and
    a reshipping step of shipping again the semiconductor memory device written with the second data to the customer;
    wherein the semiconductor memory device, before written with the first data to the memory cells, is processed with a step of electrical erasing data being held by the memory cell and a step of neutralization baking of allowing the semiconductor memory device to stand at a first ambient temperature for a first time, the predetermined ambient temperature in the baking step being lower than the first ambient temperature in the neutralization baking step.

* * * * *